(12) United States Patent
Shanmugam et al.

(10) Patent No.: US 11,574,993 B2
(45) Date of Patent: Feb. 7, 2023

(54) PACKAGE ARCHITECTURE WITH TUNABLE MAGNETIC PROPERTIES FOR EMBEDDED DEVICES

(71) Applicant: Intel Corporation, Santa Clara, CA (US)

(72) Inventors: Rengarajan Shanmugam, Chandler, AZ (US); Suddhasattwa Nad, Chandler, AZ (US); Darko Grujicic, Chandler, AZ (US); Srinivas Pietambaram, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 852 days.

(21) Appl. No.: 16/271,639

(22) Filed: Feb. 8, 2019

(65) Prior Publication Data

US 2020/0258975 A1   Aug. 13, 2020

(51) Int. Cl.
    *H01L 23/498*   (2006.01)
    *H01F 27/28*    (2006.01)
    *H01L 21/48*    (2006.01)
    *H01L 49/02*    (2006.01)
    *H01L 23/66*    (2006.01)
    *H01F 27/24*    (2006.01)
    *H01L 25/16*    (2006.01)
    *H01L 23/552*   (2006.01)
    *H01F 41/04*    (2006.01)
    *H01L 23/00*    (2006.01)

(52) U.S. Cl.
    CPC ............ *H01L 28/10* (2013.01); *H01F 27/24* (2013.01); *H01F 27/2804* (2013.01); *H01F 41/043* (2013.01); *H01L 21/486* (2013.01); *H01L 21/4857* (2013.01); *H01L 23/49822* (2013.01); *H01L 23/49827* (2013.01); *H01L 23/49838* (2013.01); *H01L 23/552* (2013.01); *H01L 23/66* (2013.01); *H01L 25/16* (2013.01); *H01F 2027/2809* (2013.01); *H01L 24/16* (2013.01); *H01L 2223/6661* (2013.01); *H01L 2224/16225* (2013.01); *H01L 2924/19011* (2013.01); *H01L 2924/19042* (2013.01); *H01L 2924/3011* (2013.01); *H01L 2924/3025* (2013.01)

(58) Field of Classification Search
    CPC ... H01L 28/10; H01L 21/4857; H01L 21/486; H01L 23/48922; H01F 27/24; H01F 27/2804; H01F 41/043
    USPC .................. 257/531, 668; 438/957
    See application file for complete search history.

(56) References Cited

U.S. PATENT DOCUMENTS

2020/0152885 A1*  5/2020  Lin et al. ............ H01L 41/0913

* cited by examiner

*Primary Examiner* — Thinh T Nguyen
(74) *Attorney, Agent, or Firm* — Schwabe, Williamson & Wyatt, P.C.

(57) ABSTRACT

Embodiments disclosed herein include electronic packages with embedded magnetic materials and methods of forming such packages. In an embodiment, the electronic package comprises a package substrate, where the package substrate comprises a plurality of dielectric layers. In an embodiment a plurality of passive components is located in a first dielectric layer of the plurality of dielectric layers. In an embodiment, first passive components of the plurality of passive components each comprise a first magnetic material, and second passive components of the plurality of passive components each comprise a second magnetic material. In an embodiment, a composition of the first magnetic material is different than a composition of the second magnetic material.

15 Claims, 13 Drawing Sheets

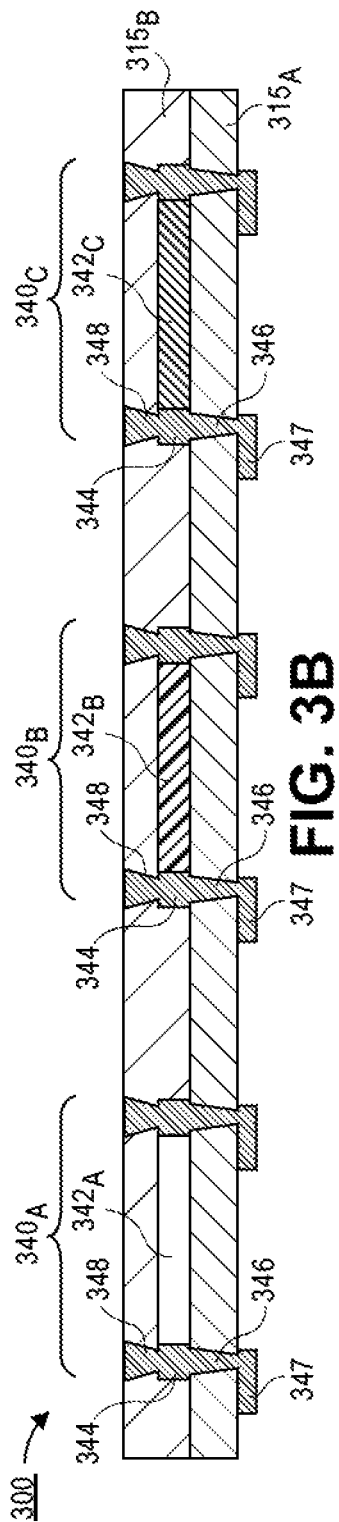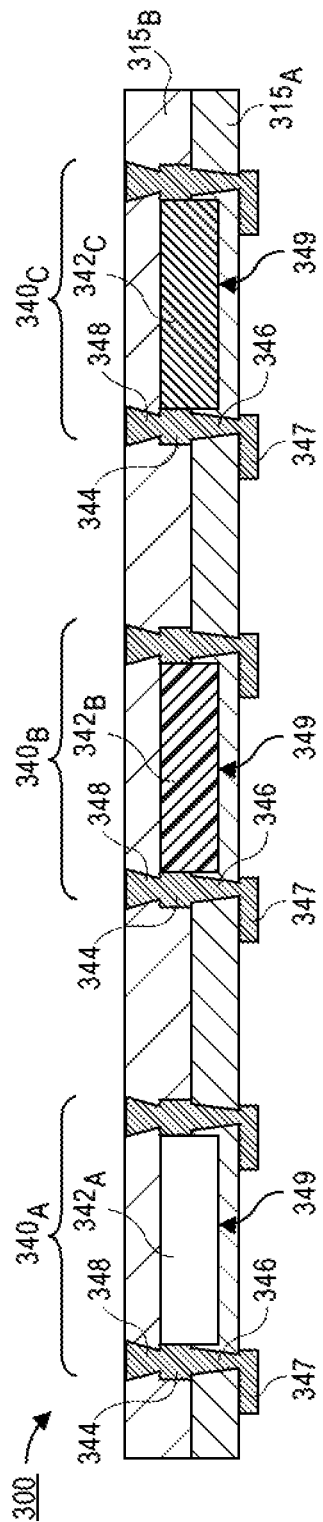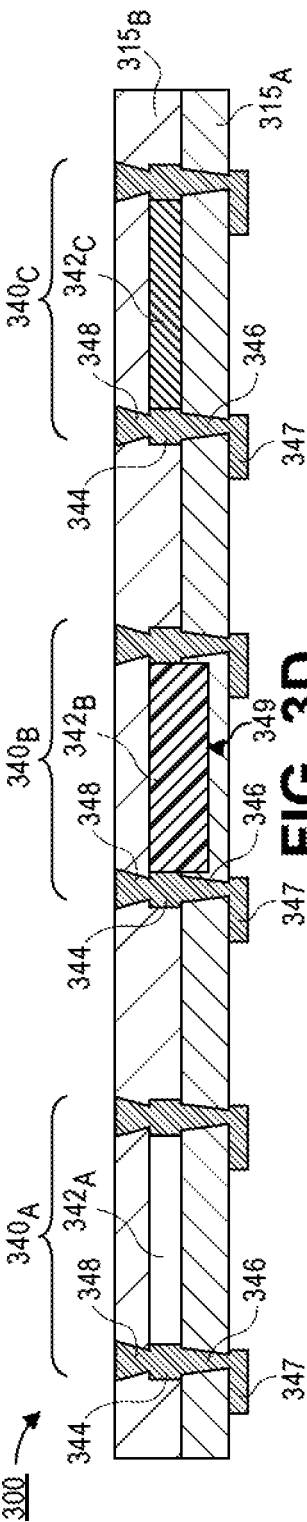

PACKAGE ARCHITECTURE WITH TUNABLE MAGNETIC PROPERTIES FOR EMBEDDED DEVICES

TECHNICAL FIELD

Embodiments of the present disclosure relate to electronic packaging, and more particularly, to electronic packages with embedded devices that include tunable magnetic properties and methods of forming such electronic packages.

BACKGROUND

In order to provide improved electrical performance, magnetic materials are embedded in electronic packages. For example, magnetic materials may be used for filtering, RF shielding, and power delivery applications. Typically, the magnetic material is deposited with a blanket deposition process and subtractively patterned. This limits the electronic package to having only a single composition of the magnetic material in each layer of an electronic package. When different magnetic material compositions are needed (e.g., to provide different functionalities), more than one package layer must be used. Accordingly, as the diversity of magnetic compositions increases to provide additional functionalities to an electronic package increases, the number of layers (and overall thickness) of the package also increases.

BRIEF DESCRIPTION OF THE DRAWINGS

FIG. 3B is a cross-sectional illustration of the plurality of inductors in FIG. 3A, in accordance with an embodiment.

FIG. 3C is a cross-sectional illustration of the plurality of inductors in FIG. 3A, in accordance with an additional embodiment.

FIG. 3D is a cross-sectional illustration of the plurality of inductors in FIG. 3A, in accordance with an additional embodiment.

EMBODIMENTS OF THE PRESENT DISCLOSURE

Figure 1:
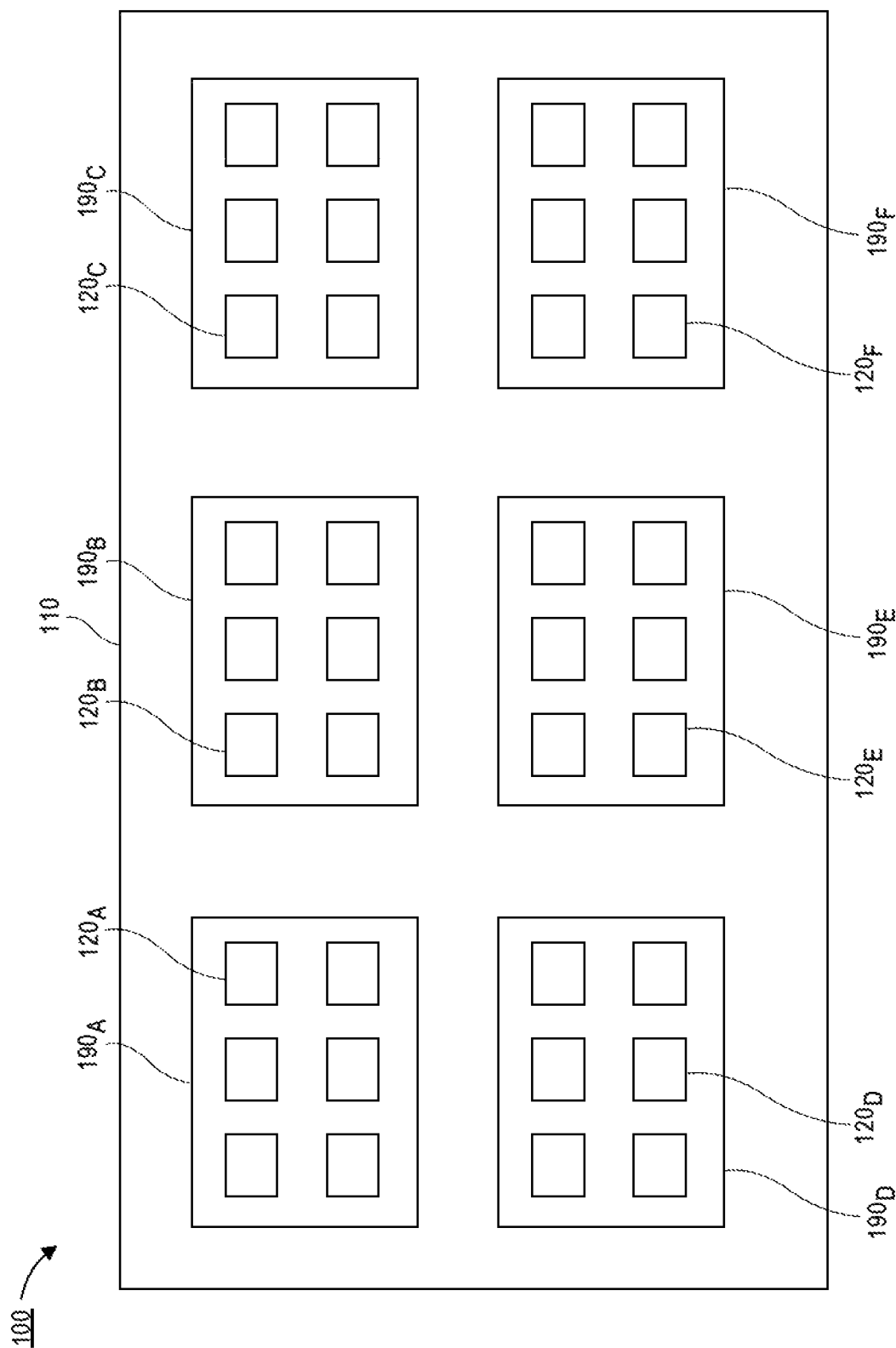
FIG. 1 is a block diagram of a package layer that includes a plurality of circuitry blocks with each circuitry block including passive components with different magnetic compositions, in accordance with an embodiment.

Described herein are electronic packages with embedded devices that include tunable magnetic properties and methods of forming such electronic packages, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, magnetic materials are embedded into electronic packages in order to provide enhanced functionalities. However, limitations of currently available processing operations restricts the electronic package to having only a single magnetic composition in each layer of the electronic package. Accordingly, when different magnetic compositions are needed, more than one package layer is needed. This results in an increase in the thickness and cost of the electronic package. Such architectures also require strict design limitations.

As such, embodiments disclosed herein include electronic packages with more than one magnetic material composition in a single layer of the electronic package. Such embodiments allow for increased functionalities within the electronic package without increasing the form factor, while reducing costs and increasing design flexibility. For example, a single layer of the electronic package may include a first circuitry block and a second circuitry block. First passive devices in the first circuitry block may include a first magnetic material with a first composition, and second passive devices in the second circuitry block may include a second magnetic material with a second composition. For example, the first circuitry block may include RF shielding components, and the second circuitry block may include power delivery components.

In an embodiment, the plurality of different magnetic material compositions within a single layer of an electronic package may be provided by a recipe driven three-dimensional (3D) printing process. The 3D printing nozzle may be driven to different locations of the electronic package layer (e.g., using registration marks on the package layer as reference marks) in order to dispense the desired magnetic material composition. In an embodiment, the 3D printing nozzle may be fed with preformed sticks having the desire composition. In other embodiments, the 3D printing nozzle may be coupled to a reservoir where the desired magnetic material composition is mixed as-needed.

Referring now to FIG. 1, a block diagram of a package layer 110 of an electronic package 100 is shown, in accordance with an embodiment. In an embodiment, the package layer 110 may be a dielectric layer on which conductive features (e.g., traces, pads, etc.) are positioned. In an embodiment, the package layer 110 may comprise a plurality of circuitry blocks $190_{A-F}$. In an embodiment, the circuitry blocks $190_{A-F}$ may be part of different functionalities enabled in the electronic package 100. For example, the circuitry blocks $190_{A-F}$ may include circuitry for one or more functionalities, such as, but not limited to, filtering, shielding, power deliver, or the like.

In an embodiment, each of the circuitry blocks $190_{A-F}$ may comprise one or more passive components 120. For example, circuitry block $190_A$ comprises passive components $120_A$, circuitry block $190_B$ comprises passive components $120_B$, circuitry block $190_C$ comprises passive components $120_C$, circuitry block $190_D$ comprises passive components $120_D$, circuitry block $190_E$ comprises passive components $120_E$, circuitry block $190_F$ comprises passive components $120_F$. While each circuitry block $190_{A-F}$ each is illustrated as having six passive components 120, it is to be appreciated that each circuitry block $190_{A-F}$ may include any number of passive components 120. That is, each of the circuitry blocks $190_{A-F}$ may not all have the same number of passive components 120.

In an embodiment, one or more of the passive components 120 in each circuitry block 190 may comprise a magnetic material. For example, the passive components $120_{A-F}$ may comprise inductors with a magnetic core. In order to provide enhanced design flexibility (e.g., to allow for a plurality of different circuitry blocks $190_{A-F}$ in a single layer 110) the passive components $120_{A-F}$ may comprise different magnetic material compositions. For example, a magnetic material composition in passive components $120_A$ may be different than a magnetic material composition in passive components $120_B$. Furthermore, embodiments disclosed herein also allow for different magnetic material compositions within a single circuitry block 190. For example, the passive components $120_A$ in circuitry block $190_A$ may comprise more than one magnetic material composition.

Figure 2A:
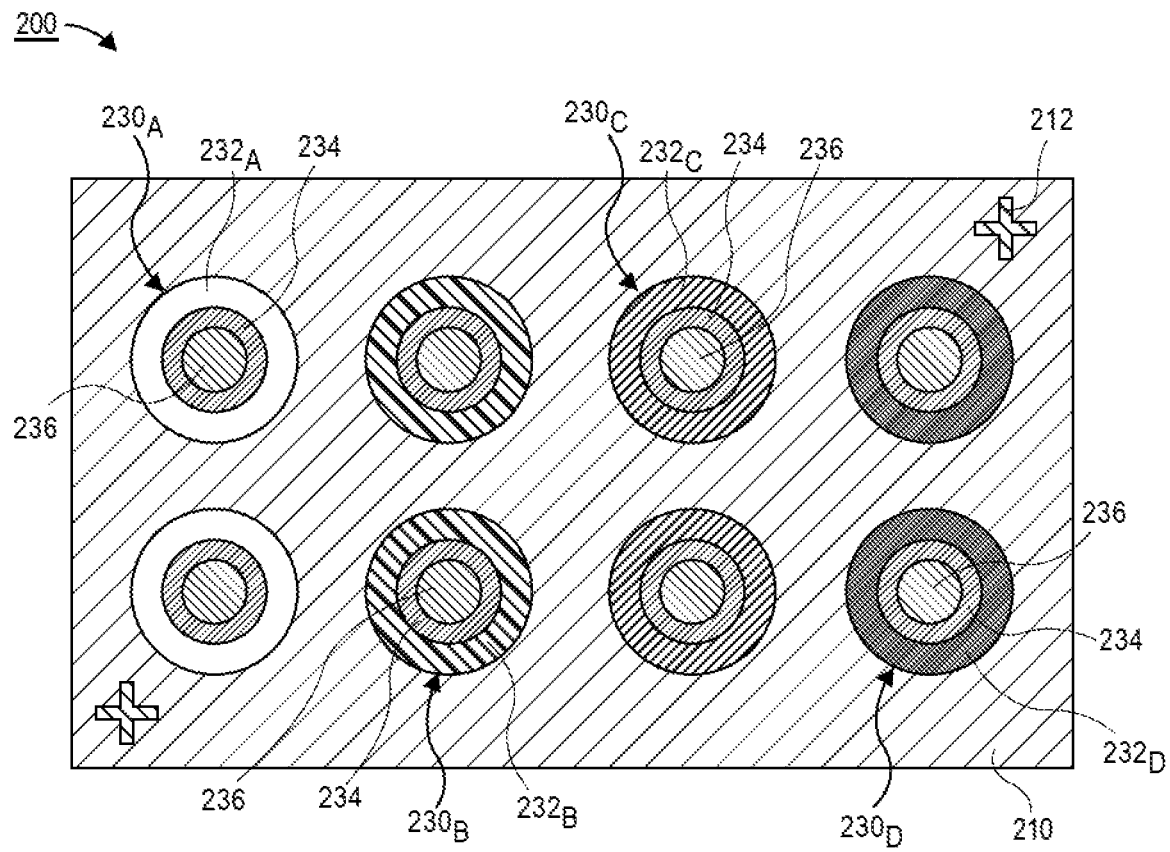
FIG. 2A is a plan view illustration of a plurality of plated through hole vias with a plurality of different magnetic compositions, in accordance with an embodiment.
Figure 2B:
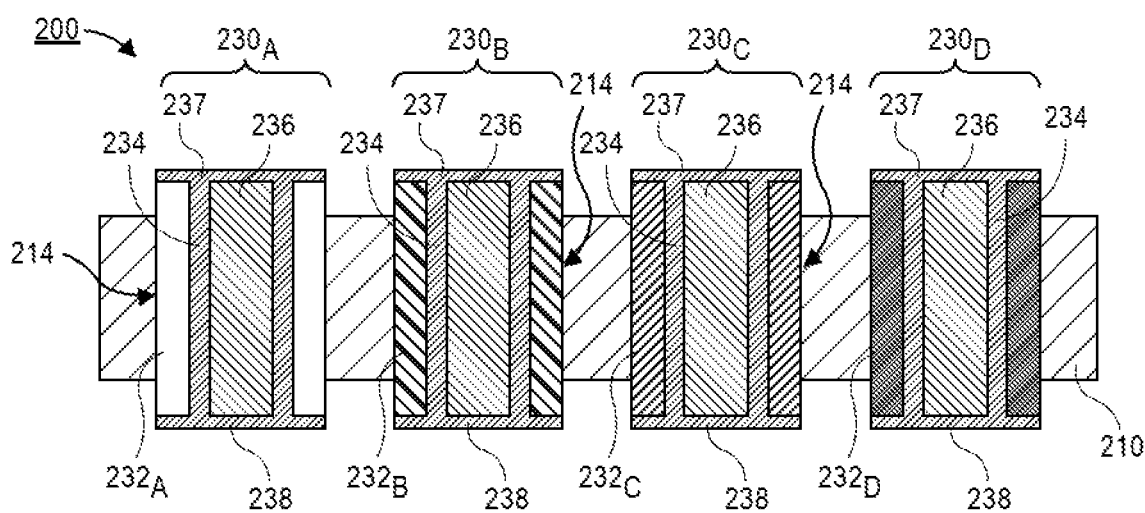
FIG. 2B is a cross-sectional illustration of the plurality of plated through hole vias in FIG. 2A, in accordance with an embodiment.

Referring now to FIG. 2A and FIG. 2B, a plan view illustration and a cross-sectional illustration of a layer 210 in an electronic package 200 are shown, respectively, in accordance with an embodiment. In an embodiment, layer 210 may be a package core or any other layer of an electronic package. In an embodiment, a plurality of plated through hole vias $230_{A-D}$ pass through the layer 210. In the exemplary illustration, the different through hole vias $230_{A-D}$ are located proximate to each other on the same layer 210. However, it is to be appreciated that the different through hole vias $230_{A-D}$ may be located at any location across the layer 210. Furthermore, while two of each type of through hole via $230_{A-D}$ are shown, it is to be appreciated that any number of each type of through hole via $230_{A-D}$ may be included in the layer 210. Furthermore, while four different types of through hole vias $230_{A-D}$ are shown, it is to be appreciated that embodiments may include two or more different types of through hole vias 230.

In an embodiment, the plurality of plated through hole vias $230_{A-D}$ may be substantially similar to each other, with the exception that they comprise magnetic shells $232_{A-D}$ that have different magnetic material compositions. In an embodiment, the magnetic shells $232_{A-D}$ may comprise any suitable magnetic material. For example, the magnetic shells $232_{A-D}$ may comprise polymeric resin materials (e.g., epoxy, acrylic, co-blended polymers, etc.) and magnetic fillers (e.g., iron oxide, nickel, cobalt, cobalt-iron, or the like).

In an embodiment, the different magnetic material compositions may include different material systems. For example, a first magnetic material composition may comprise an epoxy filled with iron oxide, and a second magnetic material composition may comprise an epoxy filled with cobalt. In other embodiments, the different magnetic material compositions may include different loading percentages of the magnetic filler. For example, a first magnetic material composition may comprise an epoxy filled with a first volume percentage of iron oxide, and a second magnetic material composition may comprise an epoxy filled with a second volume percentage of iron oxide that is different than the first volume percentage.

In an embodiment, each plated through hole via 230 may comprise a magnetic shell 232. The magnetic shell 232 may be in direct contact with sidewalls 214 of openings through the layer 210. The magnetic shells $232_{A-D}$ may all have uniform dimensions in some embodiments. In other embodiments, the magnetic shells $232_{A-D}$ may have non-uniform dimensions. That is, magnetic shells $232_A$ may have outer and/or inner diameters that are different than outer and/or inner diameters of magnetic shells $232_B$.

In an embodiment, a conductive shell 234 may line an interior of the magnetic shells 232. That is, the conductive shell 234 may be in direct contact with an interior surface of the magnetic shells 232. In other embodiments, a barrier layer (not shown) may separate the conductive shell 234 from the magnetic shell 232. In an embodiment, the conductive shell 234 may comprise copper, or the like.

In some embodiments, the conductive shell 234 may be filled with a plug 236. The plug 236 may comprise a dielectric material. In other embodiments, the plug 236 may be a magnetic material. In such embodiments, a magnetic material composition of the plug 236 may be the same as a magnetic material composition of the magnetic shell 232, or a magnetic material composition of the plug 236 may be different than a magnetic material composition of the magnetic shell 232. In an embodiment, a first pad 237 and a second pad 238 may be positioned over opposite ends of the conductive shell 234. In an embodiment, the first pad 237 and the second pad 238 may extend over top and bottom surfaces of the magnetic shell 232.

As shown in FIG. 2A, one or more registration marks 212 may be positioned over the layer 210. The registration marks 212 may be used in order to selectively deposit the magnetic material of the magnetic shells 232. As will be disclosed in greater detail below, a 3D printing nozzle may be driven to locations across the layer 210 using the registration marks 212 as guides.

Figure 3A:
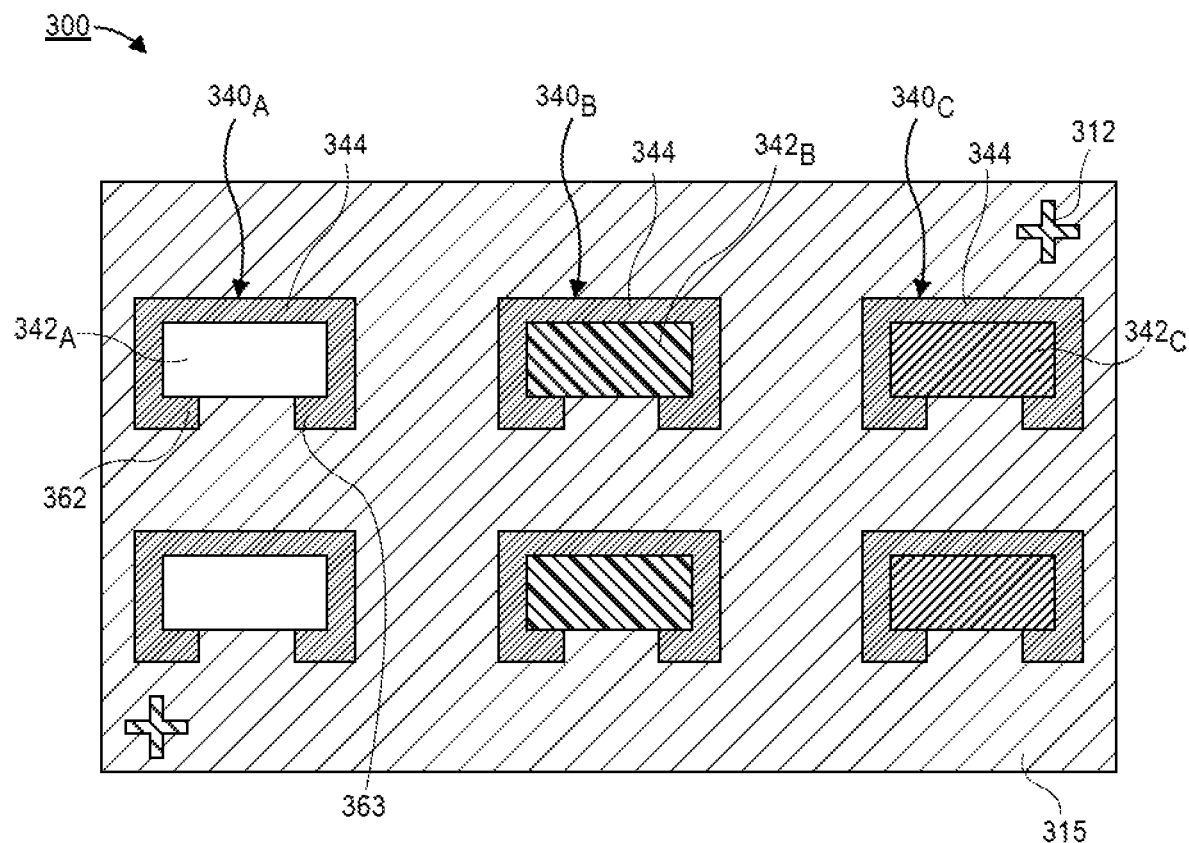
FIG. 3A is a plan view illustration of a layer of an electronic package that comprises a plurality of inductors with a plurality of different magnetic compositions, in accordance with an embodiment.

Referring now to FIG. 3A, a plan view illustration of a layer 315 of an electronic package 300 is shown, in accordance with an embodiment. In an embodiment, the layer 315 may be any layer in an electronic package. For example, the layer 315 may be one dielectric layer of a plurality of stacked dielectric layers. In other embodiments, layer 315 may be a core layer of a cored electronic package. In an embodiment, a plurality of inductors $340_{A\text{-}C}$ are positioned over the layer 315. In the exemplary illustration, the different inductors $340_{A\text{-}C}$ are located proximate to each other on the same layer 315. However, it is to be appreciated that the different inductors $340_{A\text{-}C}$ may be located at any location across the layer 315. Furthermore, while two of each type of inductor $340_{A\text{-}C}$ are shown, it is to be appreciated that any number of each type of inductor $340_{A\text{-}C}$ may be included in the layer 315. Furthermore, while three different types of inductors $340_{A\text{-}C}$ are shown, it is to be appreciated that embodiments may include two or more different types of inductors 340.

In an embodiment, the inductors $340_{A\text{-}C}$ may each comprise a conductive trace 344. The conductive trace 344 may be positioned over a surface of the layer 315. In an embodiment, the conductive trace 344 may be a planar inductor. For example, the conductive trace 344 may be an open loop. That is, the conductive trace 344 may have a first end 362 and a second end 363 that are not in contact with each other. In an embodiment, the conductive trace 344 may comprise any suitable conductive material typical of electronics packaging. For example, the conductive trace 344 may comprise copper or the like. Embodiments may also include conductive traces 344 that include barrier layers, fill layers, or the like. The conductive traces 344 may all have uniform dimensions in some embodiments. In other embodiments, the conductive traces 344 may have non-uniform dimensions. That is, conductive trace $344_A$ may be an open loop that is larger or smaller in dimension than the open loop of conductive trace $344_B$ In an embodiment, the plurality of inductors $340_{A\text{-}C}$ may be substantially similar to each other, with the exception that magnetic material compositions of magnetic cores $342_{A\text{-}C}$ are different from each other. The magnetic cores $342_{A\text{-}C}$ may substantially fill the open loops of the conductive traces 344. In an embodiment, the magnetic cores $342_{A\text{-}C}$ may comprise any suitable magnetic material. For example, the magnetic cores $342_{A\text{-}C}$ may comprise polymeric resin materials (e.g., epoxy, acrylic, co-blended polymers, etc.) and magnetic fillers (e.g., iron oxide, nickel, cobalt, cobalt-iron, or the like).

In an embodiment, the different magnetic material compositions may include different material systems. For example, a first magnetic material composition may comprise an epoxy filled with iron oxide, and a second magnetic material composition may comprise an epoxy filled with cobalt. In other embodiments, the different magnetic material compositions may include different loading percentages of the magnetic filler. For example, a first magnetic material composition may comprise an epoxy filled with a first volume percentage of iron oxide, and a second magnetic material composition may comprise an epoxy filled with a second volume percentage of iron oxide that is different than the first volume percentage.

As shown in FIG. 3A, one or more registration marks 312 may be positioned over the layer 315. The registration marks 312 may be used in order to selectively deposit the magnetic material of the magnetic cores 342. As will be disclosed in greater detail below, a 3D printing nozzle may be driven to locations across the layer 315 using the registration marks 312 as guides.

Referring now to FIG. 3B, a cross-sectional illustration of the electronic package 300 in FIG. 3A along a row of the inductors $340_{A\text{-}C}$ is shown, in accordance with an embodiment. In an embodiment, the electronic package 300 may comprise a first layer $315_A$ and a second layer $315_B$. The plurality of inductors $340_{A\text{-}C}$ may be positioned over the first layer $315_A$, and the second layer $315_E$ may be positioned over and around the plurality of inductors $340_{A\text{-}C}$.

In an embodiment, each of the inductors 340 may have a magnetic core 342 that is laterally surrounded by the conductive trace 344. That is, sidewall surfaces of the magnetic core 342 may be in direct contact with sidewalls of the conductive trace 344. In other embodiments, a barrier layer (not shown) may separate the magnetic core 342 from the conductive trace 344. In an embodiment, the magnetic core 342 may have a thickness that is substantially similar to a thickness of the conductive trace 344. For example, a top surface of the conductive trace 344 may be substantially coplanar with a top surface of the magnetic core 342. In other embodiments, a thickness of the magnetic core 342 may be larger or smaller than a thickness of the conductive trace 344.

In an embodiment the inductors 340 may be connected to other circuitry (e.g., trace 347) on a different layer of the electronic package 300 with vias 346 and/or vias 348. For example, vias 346 contact the conductive trace 344 from below and pass through layer $315_A$, and vias 348 contact the conductive trace 344 from above and pass through layer $315_B$. In other embodiments, the inductors 340 may also be electrically coupled to circuitry on the same layer. That is, the inductors 340 may not be directly contacted by vias 346 or 348 from above or below.

Referring now to FIG. 3C, a cross-sectional illustration of an electronic package 300 with inductors 340 is shown in accordance with an additional embodiment. The inductors 340 may be substantially similar to the inductors 340 in FIG. 3B, with the exception that the magnetic cores 342 are recessed into the first layer $315_A$. In an embodiment, cavities 349 may extend into the first layer $315_A$ and be filled with the magnetic cores 342. Such embodiments may provide improved performance since the volume of magnetic material surrounded by the conductive trace 344 is increased.

Referring now to FIG. 3D, a cross-sectional illustration of an electronic package 300 with a plurality of inductors 340 is shown, in accordance with an additional embodiment. In an embodiment, the inductors $340_{A\text{-}C}$ may be substantially similar to the inductors $340_{A\text{-}C}$ in FIG. 3B and inductors $340_{A-C}$ in FIG. 3C. Particularly, some of the inductors (e.g., inductors $340_A$ and $340_C$) are positioned over the first layer $315_A$, and other inductors (e.g., inductor $340_B$) may be recessed into cavities 349 in the first layer $315_A$.

Figure 3E:
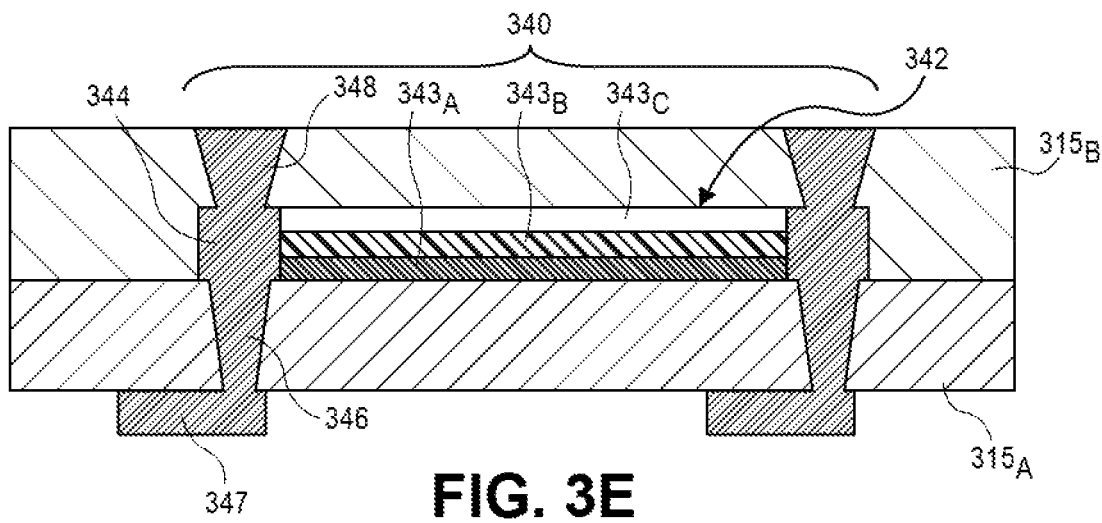
FIG. 3E is a cross-sectional illustration of an inductor that comprises a plurality magnetic materials with different compositions, in accordance with an embodiment.

Referring now to FIG. 3E, a cross-sectional illustration of an inductor 340 is shown, in accordance to an additional embodiment. Whereas the inductors 340 described above with respect to FIGS. 3A-3D include a single magnetic material composition per inductor, embodiments are not limited to such configurations. For example, a plurality of magnetic layers $343_{A-C}$ with two or more different magnetic material compositions may be stacked to form a magnetic core 342 between the conductive trace 344. Such an embodiment may be beneficial when a higher permeability is needed (e.g., greater than 10). Without the use of a stacked configuration, a suitable single composition material would require a magnetic filler content and size that may result in undesirable effects, especially at high frequencies. Accordingly, alternating layers of high and low permeability magnetic filler blended polymers may be used. This results in an increase to the overall permeability of the core, while also preserving desired magnetic properties.

In FIG. 3E, three magnetic layers $343_{A-C}$ with different magnetic material compositions are shown. However, embodiments are not limited to such configurations. For example, the magnetic core 342 may comprise two or more magnetic layers 343 with different magnetic material compositions. In an embodiment, the magnetic layers 343 may be arranged in a graded pattern. That is, the magnetic composition of the magnetic layers 343 in a magnetic core 342 may increase or decrease with each successive magnetic layer 343. In other embodiments, the magnetic layers 343 may be arranged in an alternating pattern. For example, the magnetic composition of the magnetic layers 343 in a magnetic core 342 may alternate between a first composition and a second composition.

Referring now to FIGS. 4A-4F, a series of cross-sectional illustrations of a process for forming a plated through hole with a magnetic shell using a 3D printing nozzle is shown, in accordance with an embodiment. The use of a 3D printing nozzle allows for recipe driven fabrication of plated through holes that enables the use of more than one magnetic material composition in a single layer. The tailoring of the magnetic material composition across a single layer provides greater design flexibility and may allow for a reduction in the number of layers in the electronic package.

Figure 4A:
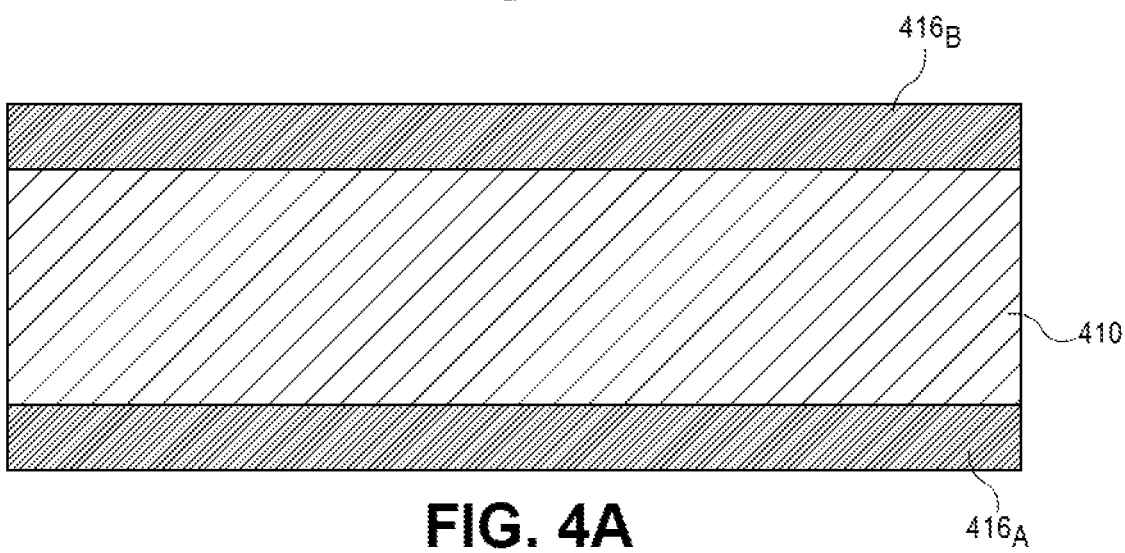
FIG. 4A is a cross-sectional illustration of a package core, in accordance with an embodiment.

Referring now to FIG. 4A, a cross-sectional illustration of a package layer 410 is shown, in accordance with an embodiment. In a particular embodiment, the layer 410 may be a package core (e.g., for a cored electronic package). In an embodiment, a first conductive layer $416_A$ may be positioned over a first surface of the layer 410, and a second conductive layer $416_E$ may be positioned over a second surface of the layer 410. In an embodiment, the first conductive layer $416_A$ and the second conductive layer $416_E$ may be copper or the like. The first conductive layer $416_A$ and the second conductive layer $416_E$ may be disposed over the layer 410 with any suitable process (e.g., plating, depositing, laminating, or the like).

Figure 4B:
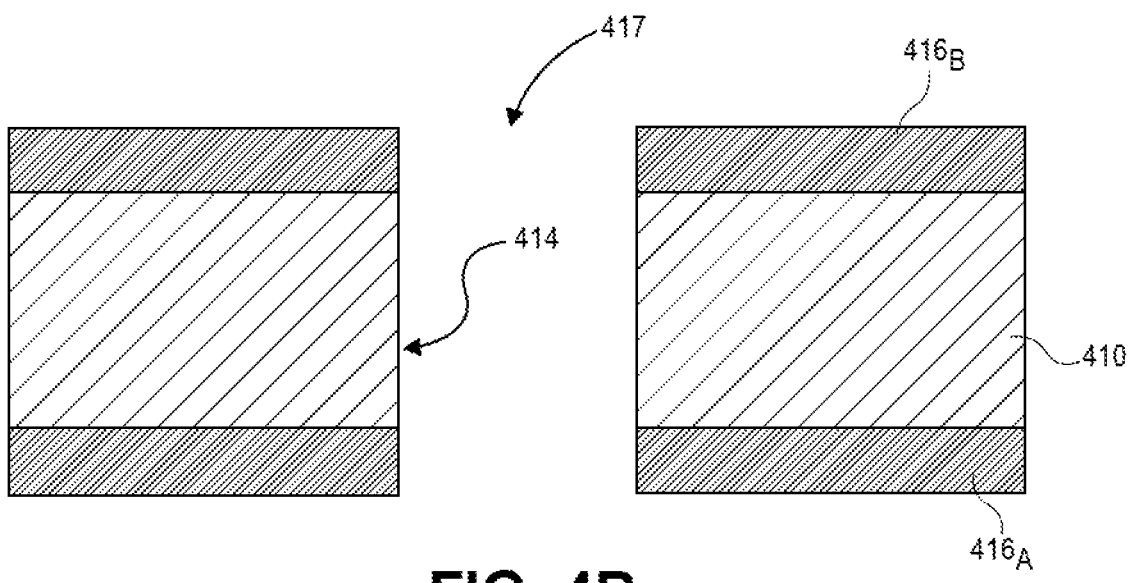
FIG. 4B is a cross-sectional illustration of the package core after the formation of a through hole opening through the package core, in accordance with an embodiment.

Referring now to FIG. 4B, a cross-sectional illustration of layer 410 after a through hole opening 417 is made through the layer 410 is shown, in accordance with an embodiment. In an embodiment, the through hole opening 417 may be formed with a laser drilling process, an etching process, or the like. In an embodiment, sidewalls 414 of the through hole opening 417 may be substantially vertical. In other embodiments, the sidewalls 414 of the through hole opening 417 may be tapered, as is typically characteristic of a laser drilled through hole opening 417.

Figure 4C:
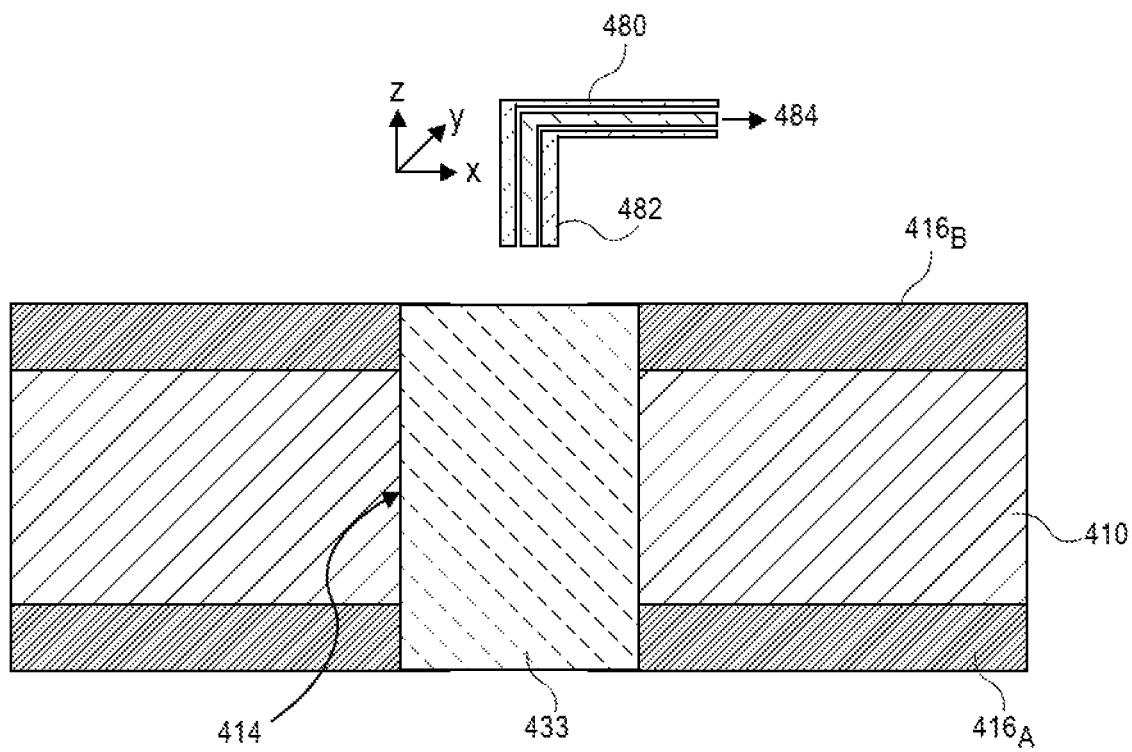
FIG. 4C is a cross-sectional illustration of the package core after a magnetic material is disposed in the through hole opening with a three-dimensional (3D) printing nozzle, in accordance with an embodiment.

Referring now to FIG. 4C, a cross-sectional illustration after the through hole opening 417 is filled with a magnetic material 433 is shown, in accordance with an embodiment. In an embodiment, the magnetic material 433 may be dispensed into the through hole opening 417 by a 3D printing apparatus 480. The 3D printing apparatus 480 may include a 3D printing nozzle 482. The 3D printing nozzle 482 may be configured to provide fine control of the deposited material and be compatible with scaling (e.g., to micron and sub-micron scales). In an embodiment, the 3D printing nozzle 482 comprises a heating element for melting feedstock 484 of the magnetic material 433 in order to dispense the magnetic material 433 in a controlled manner.

In an embodiment, the 3D printing apparatus 480 is displaceable relative to the layer 410. For example, the 3D printing apparatus 480 may be displaced in the X, Y, and Z directions. The 3D printing apparatus 480 may be driven about the first layer using registration marks (e.g. registration marks such as registration marks 212 described above with respect to FIG. 2A) as references points.

Since the 3D printing apparatus 480 may be driven to different locations over the layer 410, magnetic material 433 may be selectively deposited to fill the openings 417. This allows for more than one magnetic material composition to be dispensed in the layer 410. For example, the feedstock 484 of the magnetic material 433 may be changed out depending on location of the 3D printing nozzle 482. In an embodiment, the feedstock 484 may comprise a first prefabricated stick having of first magnetic material composition. When a second magnetic material composition is needed, the first prefabricated stick may be switched out with a second prefabricated stick with a second magnetic material composition. In other embodiments, the feedstock 484 may be housed in a reservoir where the desired composition is provided by mixing the magnetic filler particles with the polymer on an as needed basis.

Figure 4D:
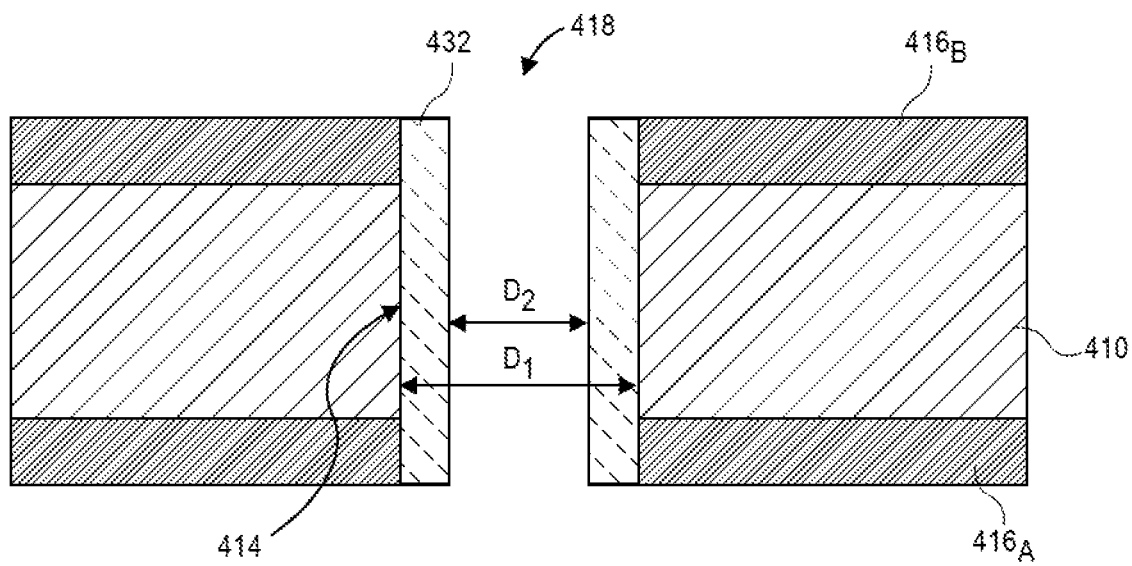
FIG. 4D is a cross-sectional illustration of the package core after an opening through the magnetic material is formed, in accordance with an embodiment.

Referring now to FIG. 4D, a cross-sectional illustration after an opening 418 through the magnetic material 433 is made to form a magnetic shell 432 is shown, in accordance with an embodiment. In an embodiment, the opening 418 may be formed with a laser drilling process, an etching process, or the like. In an embodiment, the opening 418 results in the magnetic shell 432 having an outer diameter $D_1$ and an inner diameter $D_2$.

Figure 4E:
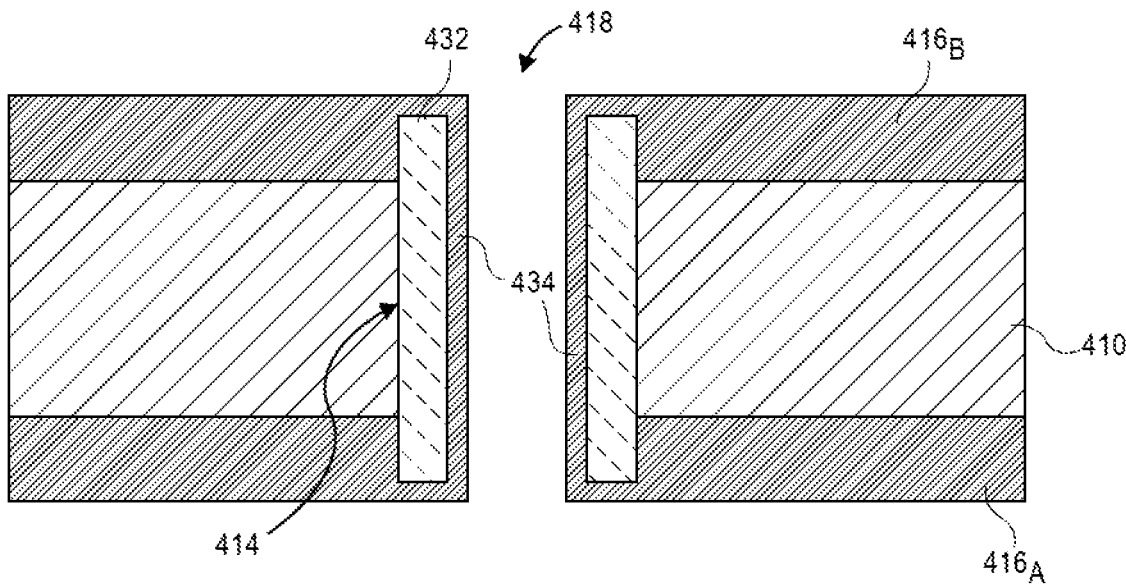
FIG. 4E is a cross-sectional illustration after the opening is plated with a conductive material, in accordance with an embodiment.

Referring now to FIG. 4E, a cross-sectional illustration after the opening 418 is plated is shown, in accordance with an embodiment. In an embodiment, the opening 418 is plated with an electroplating or an electroless plating process to form a conductive shell 434 surrounded by the magnetic shell 432. In an embodiment, the plating process may also result in top and bottom surfaces of the magnetic shell 432 being covered by the conductive material.

Figure 4F:
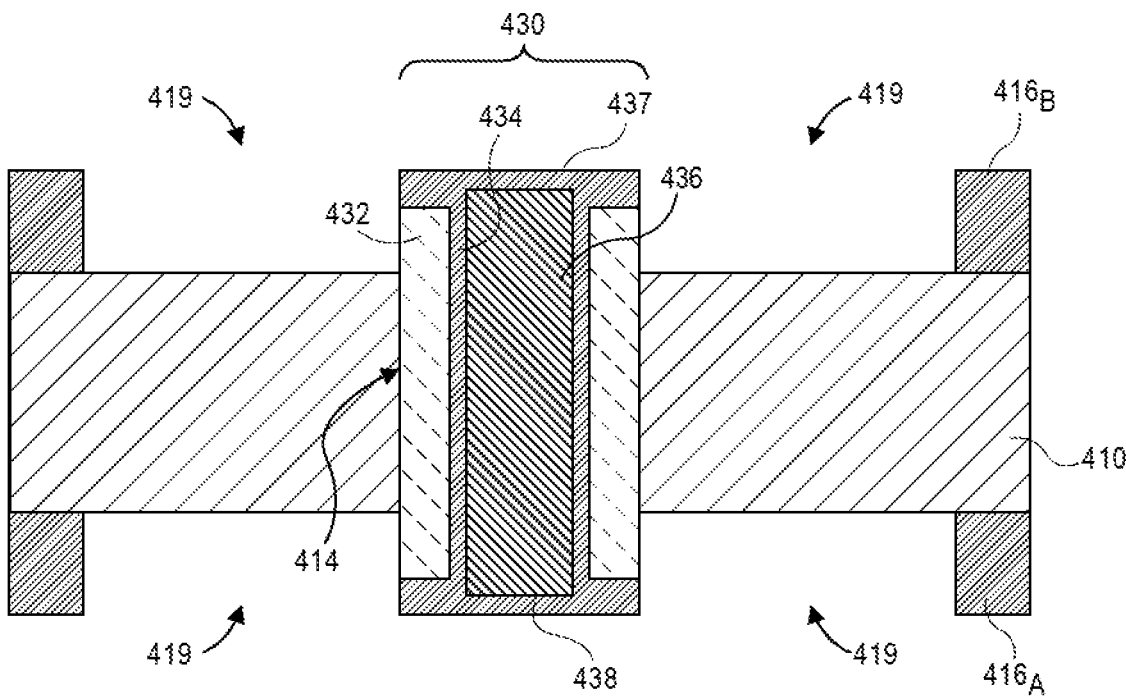
FIG. 4F is a cross-sectional illustration after the opening is filled with an inductor core, and conductive layers over the package core are patterned, in accordance with an embodiment.

Referring now to FIG. 4F, a cross-sectional illustration after the through hole via 430 is completed is shown, in accordance with an embodiment. In an embodiment, a plug 436 may be surrounded by an inner diameter of the conductive shell 432. The plug 436 may be a dielectric material. In other embodiments, the plug 436 may be a magnetic material. In such embodiments, the plug 436 may have a different magnetic material composition than the magnetic shell 432, or the plug 436 may have the same magnetic material composition as the magnetic shell 432.

In an embodiment, a first pad 437 may be disposed over a first end surface of the plug 436, and a second pad 438 may be disposed over a second end surface of the plug 436. In an embodiment, the first conductive layer $416_A$ and the second conductive layer $416_E$ may be patterned to form openings 419 that define the first pad 437 and the second pad 438. For example, the first conductive layer $416_A$ and the second conductive layer $416_E$ may be patterned with lithographic operations common to the electronic packaging industry.

Referring now to FIGS. 5A-5E, a series of cross-sectional and plan view illustrations of a process for forming an inductor with a magnetic core using a 3D printing nozzle is shown, in accordance with an embodiment. The use of a 3D printing nozzle allows for recipe driven fabrication of inductors that enables the use of more than one magnetic material composition in a single layer. The tailoring of the magnetic material composition across a single layer provides greater design flexibility and may allow for a reduction in the number of layers in the electronic package.

Figure 5A:
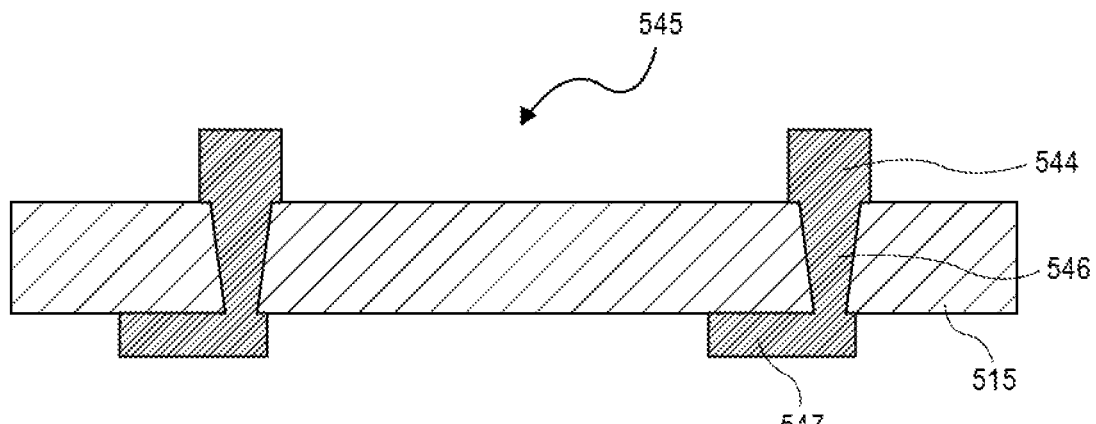
FIG. 5A is a cross-sectional illustration of a inductor over a first dielectric layer of an electronic package, in accordance with an embodiment.
Figure 5B:
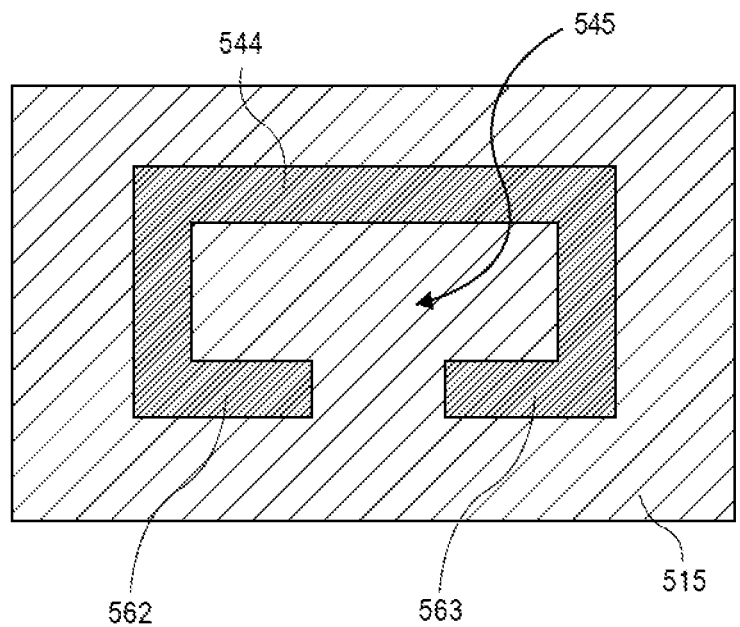
FIG. 5B is a plan view illustration of the inductor in FIG. 5A, in accordance with an embodiment.

Referring now to FIGS. 5A and 5B, a cross-sectional illustration and a corresponding plan view illustration of a conductive trace 544 over a layer 515 of an electronic package are shown, respectively, in accordance with an embodiment. In an embodiment, the layer 515 may be a dielectric layer (e.g., one of a plurality of dielectric layers in an electronic package) or a core (e.g., a core of a cored electronic package).

In an embodiment, the conductive trace 544 may be may be positioned over a surface of the layer 515. In an embodiment, the conductive trace 544 may be a planar inductor 544. For example, the conductive trace 544 may be an open loop. That is, the conductive trace 544 may have a first end 562 and a second end 563 that are not in contact with each other. In an embodiment, the open loop defines a volume 545 bounded (at least partially) by the conductive trace 544. The volume 545 provides boundary that retains the magnetic material that will be dispensed in a subsequent processing operation. In an embodiment, the conductive trace 544 may comprise any suitable conductive material typical of electronics packaging. For example, the conductive trace 544 may comprise copper or the like. Embodiments may also include conductive traces 544 that include barrier layers, fill layers, or the like.

In an embodiment, vias 546 may pass through the layer 515 to provide electrical connection from a bottom surface of the conductive trace 544 to traces 547 on an opposite surface of the layer 515. In other embodiments, the conductive trace 544 may be electrically coupled to other traces (not shown) over the same surface of the layer 515. That is, in some embodiments, the entire bottom surface of the conductive trace 544 is in direct contact with the first layer 515.

Figure 5C:
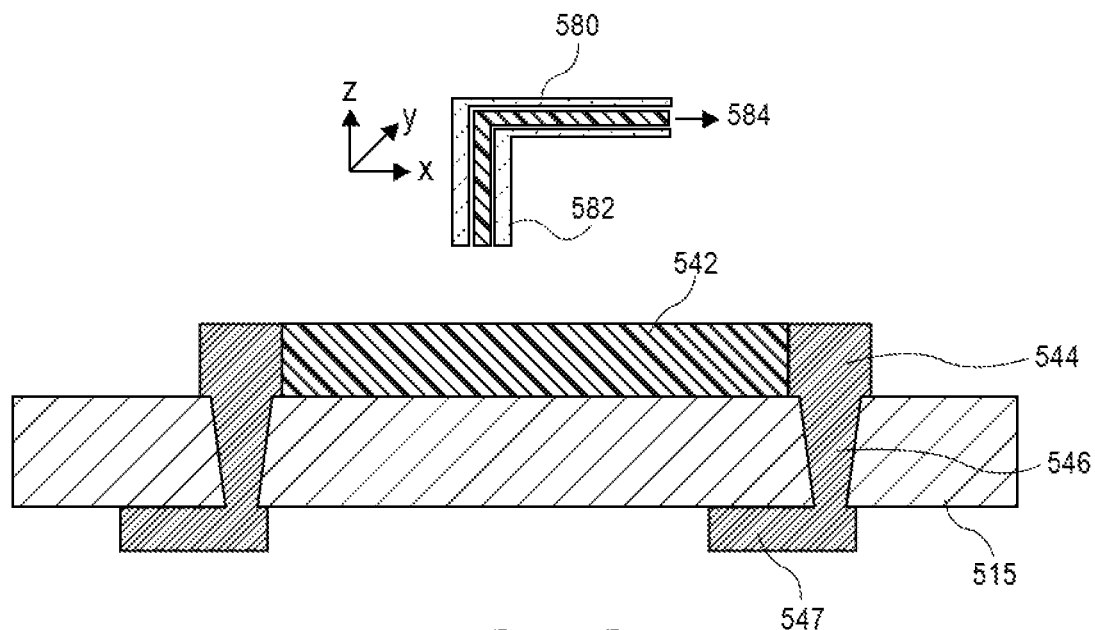
FIG. 5C is a cross-sectional illustration of the inductor after a magnetic material is disposed in the inductor with a 3D printing nozzle, in accordance with an embodiment.
Figure 5D:
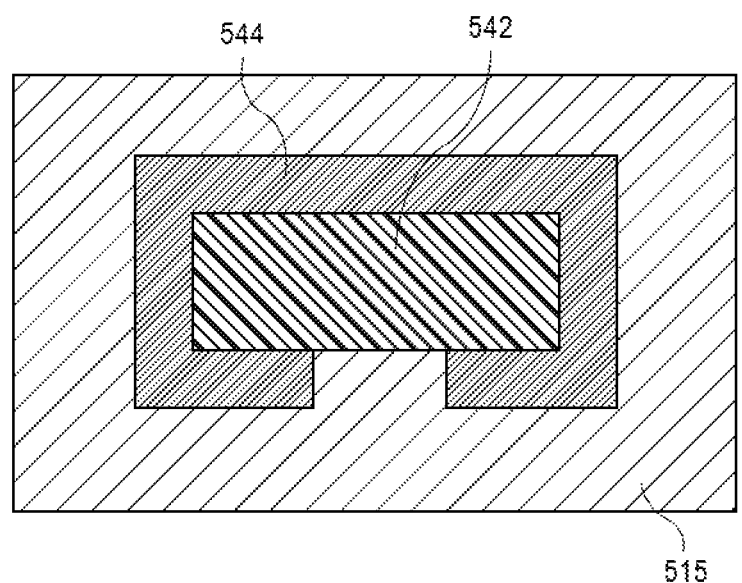
FIG. 5D is a plan view illustration of the inductor in FIG. 5C, in accordance with an embodiment.

Referring now to FIGS. 5C and 5D, a cross-sectional illustration and a plan view illustration after a magnetic core 542 is dispensed into the volume 545 are shown, respectively, in accordance with an embodiment. In an embodiment, the magnetic core 542 may be dispensed into the volume 545 by a 3D printing apparatus 580. The 3D printing apparatus 580 may include a 3D printing nozzle 582. The 3D printing nozzle 582 may be configured to provide fine control of the deposited material and be compatible with scaling (e.g., to micron and sub-micron scales). In an embodiment, the 3D printing nozzle 582 comprises a heating element for melting feedstock 584 of the magnetic core 542 in order to dispense the magnetic core 542 in a controlled manner.

In an embodiment, the 3D printing apparatus 580 is displaceable relative to the layer 515. For example, the 3D printing apparatus 580 may be displaced in the X, Y, and Z directions. The 3D printing apparatus 580 may be driven about the first layer using registration marks (e.g. registration marks such as registration marks 312 described above with respect to FIG. 3A) as references points.

Since the 3D printing apparatus 580 may be driven to different locations over the layer 515, magnetic material may be selectively deposited to fill volumes 545 to produce the magnetic core 542. This allows for more than one magnetic material composition to be dispensed into the volume 545. For example, the feedstock 584 of the magnetic material may be changed out depending on location of the 3D printing nozzle 582. In an embodiment, the feedstock 584 may comprise a first prefabricated stick having of first magnetic material composition. When a second magnetic material composition is needed, the first prefabricated stick may be switched out with a second prefabricated stick with a second magnetic material composition. In other embodiments, the feedstock 584 may be housed in a reservoir where the desired composition is provided by mixing the magnetic filler particles with the polymer on an as needed basis.

Figure 5E:
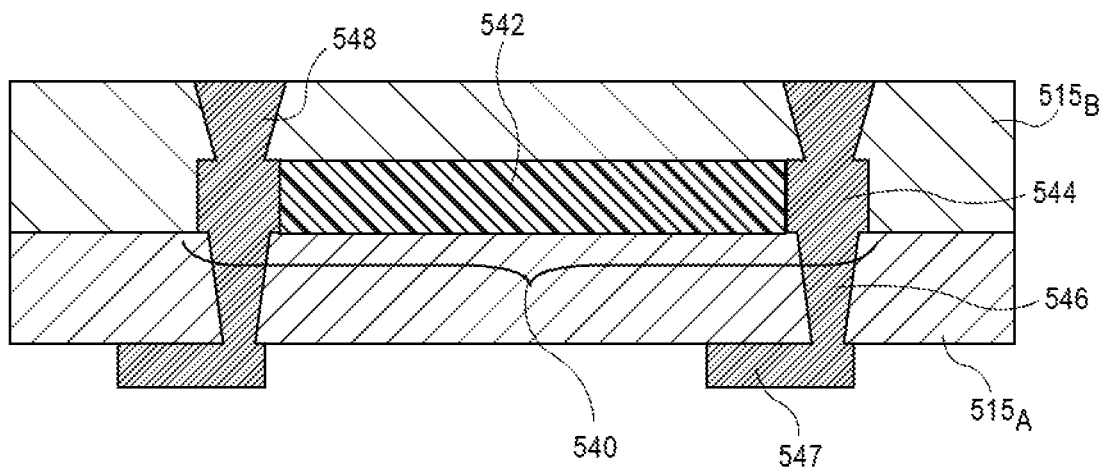
FIG. 5E is a cross-sectional illustration after a second dielectric layer of the electronic package is disposed over the inductor, in accordance with an embodiment.

Referring now to FIG. 5E, a cross-sectional illustration after a second layer $515_E$ is disposed over the first layer $515_A$ is shown, in accordance with an embodiment. In an embodiment, the second layer $515_E$ may be a second dielectric layer in an electronic package. The second layer $515_E$ may be positioned over and around the inductor 540. In some embodiments, vias 548 may pass through the second layer $515_E$ to provide electrical connections to a top surface of the conductive trace 544. In an embodiment, the second layer $515_E$ may be a laminated layer, or any other layer deposition process may be used to dispose the second layer $515_E$ over the first layer $515_A$.

Figure 6A:
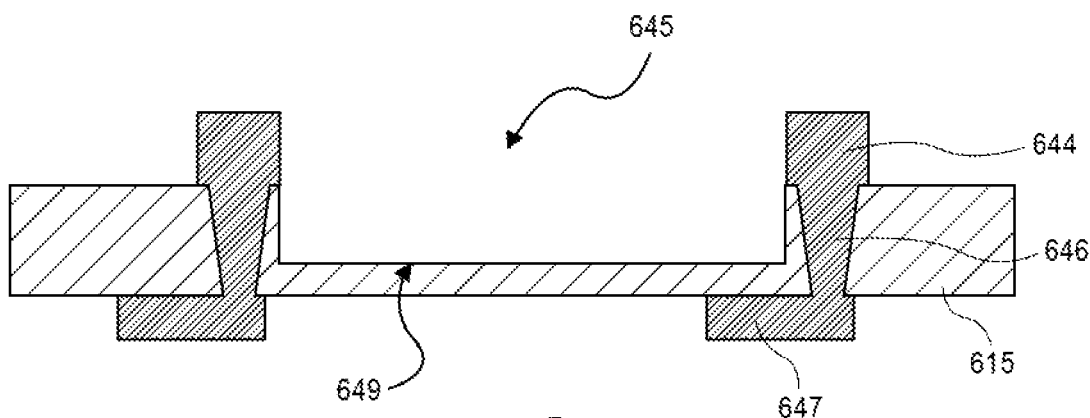
FIG. 6A is a cross-sectional illustration of an inductor over a first dielectric layer of an electronic package with a cavity formed into the first dielectric layer, in accordance with an embodiment.
Figure 6B:
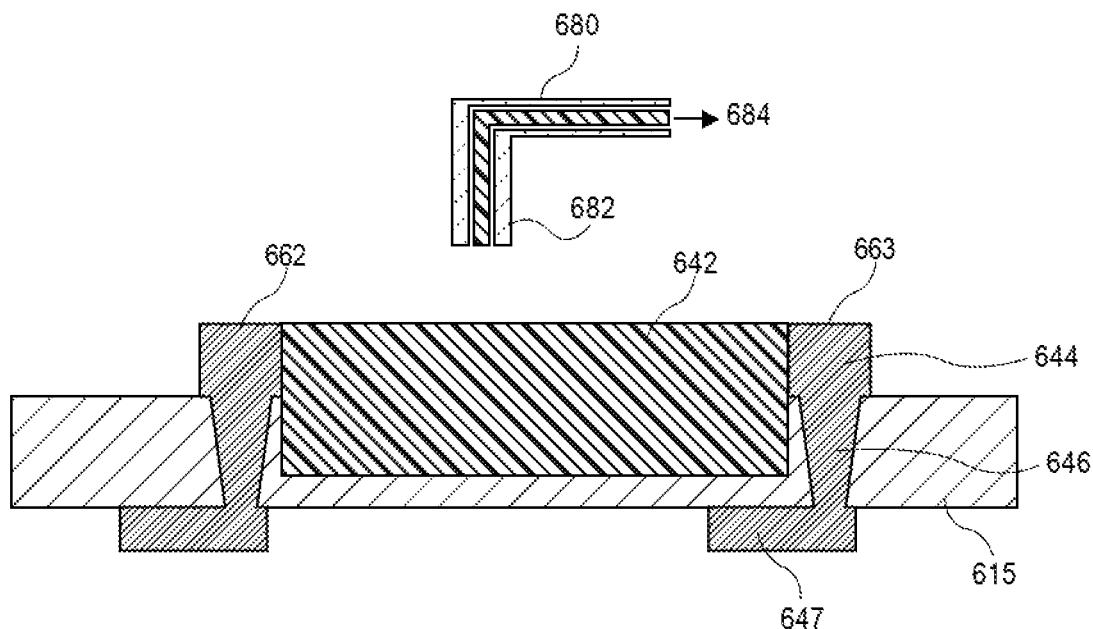
FIG. 6B is a cross-sectional illustration after a magnetic material is disposed into the cavity with a 3D printing nozzle, in accordance with an embodiment.
Figure 6C:
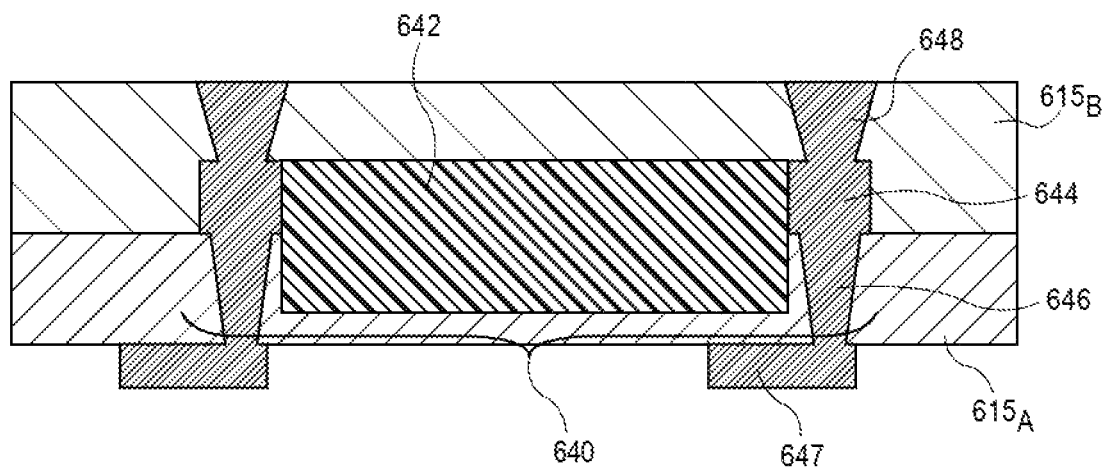
FIG. 6C is a cross-sectional illustration after a second dielectric layer of the electronic package is disposed over the inductor, in accordance with an embodiment.

Referring now to FIGS. 6A-6C a series of cross-sectional illustrations that depict a process for forming an inductor with a magnetic core using a 3D printing nozzle is shown, in accordance with an embodiment. The use of a 3D printing nozzle allows for recipe driven fabrication of inductors that enables the use of more than one magnetic material composition in a single layer. The tailoring of the magnetic material composition across a single layer provides greater design flexibility and may allow for a reduction in the number of layers in the electronic package.

Referring now to FIG. 6A, a cross-sectional illustration of a conductive trace 644 over a layer 615 of an electronic package is shown, in accordance with an embodiment. In an embodiment, the layer 615 may be a dielectric layer (e.g., one of a plurality of dielectric layers in an electronic package) or a core (e.g., a core of a cored electronic package).

In an embodiment, the conductive trace 644 may be positioned over a surface of the layer 615. In an embodiment, the conductive trace 644 may be a planar inductor 644. For example, the conductive trace 644 may be an open loop. That is, the conductive trace 644 may have a first end 662 and a second end 663 that are not in contact with each other. In an embodiment, the open loop defines a volume 645 bounded (at least partially) by the conductive trace 644. The volume 645 provides boundary that retains the magnetic material that will be dispensed in a subsequent processing operation. In an embodiment, a cavity 649 may be recessed into the layer 615 in order to increase the magnitude of volume 645. In an embodiment, the cavity 649 may be formed with a laser drilling process, or the like. The sidewalls of the cavity 649 are illustrated as being substantially vertical. However, it is to be appreciated that sidewalls of the cavity 649 may be tapered, as is characteristic of laser drilled features in electronic packaging applications. In an embodiment, the conductive trace 644 may comprise any suitable conductive material typical of electronics packaging. For example, the conductive trace 644 may comprise copper or the like. Embodiments may also include conductive traces 644 that include barrier layers, fill layers, or the like.

In an embodiment, vias 646 may pass through the layer 615 to provide electrical connection from a bottom surface of the conductive trace 644 to traces 647 on an opposite surface of the layer 615. In other embodiments, the conductive trace 644 may be electrically coupled to other traces (not shown) over the same surface of the layer 615. That is, in some embodiments, the entire bottom surface of the conductive trace 644 is in direct contact with the first layer 615.

Referring now to FIG. 6B, a cross-sectional illustration after the magnetic core 642 is disposed in the volume 645 is shown, in accordance with an embodiment. In an embodiment, the magnetic core 642 may be dispensed into the volume 645 by a 3D printing apparatus 680. The 3D printing apparatus 680 may include a 3D printing nozzle 682. The 3D printing nozzle 682 may be configured to provide fine control of the deposited material and be compatible with scaling (e.g., to micron and sub-micron scales). In an embodiment, the 3D printing nozzle 682 comprises a heating element for melting feedstock 684 of the magnetic core 642 in order to dispense the magnetic core 642 in a controlled manner.

In an embodiment, the 3D printing apparatus 680 is displaceable relative to the layer 615. For example, the 3D printing apparatus 680 may be displaced in the X, Y, and Z directions. The 3D printing apparatus 680 may be driven about the first layer using registration marks (e.g. registration marks such as registration marks 312 described above with respect to FIG. 3A) as references points.

Since the 3D printing apparatus 680 may be driven to different locations over the layer 615, magnetic material may be selectively deposited to fill volumes 645 to produce the magnetic core 642. This allows for more than one magnetic material composition to be dispensed into the volume 645. For example, the feedstock 684 of the magnetic material may be changed out depending on location of the 3D printing nozzle 682. In an embodiment, the feedstock 684 may comprise a first prefabricated stick having of first magnetic material composition. When a second magnetic material composition is needed, the first prefabricated stick may be switched out with a second prefabricated stick with a second magnetic material composition. In other embodiments, the feedstock 684 may be housed in a reservoir where the desired composition is provided by mixing the magnetic filler particles with the polymer on an as needed basis.

Referring now to FIG. 6C, a cross-sectional illustration after a second layer 615E is disposed over the first layer 615A is shown, in accordance with an embodiment. In an embodiment, the second layer 615E may be a second dielectric layer in an electronic package. The second layer 615E may be positioned over and around the inductor 640. In some embodiments, vias 648 may pass through the second layer 615E to provide electrical connections to a top surface of the conductive trace 644. In an embodiment, the second layer 615E may be a laminated layer, or any other layer deposition process may be used to dispose the second layer 615E over the first layer 615A.

Figure 7:
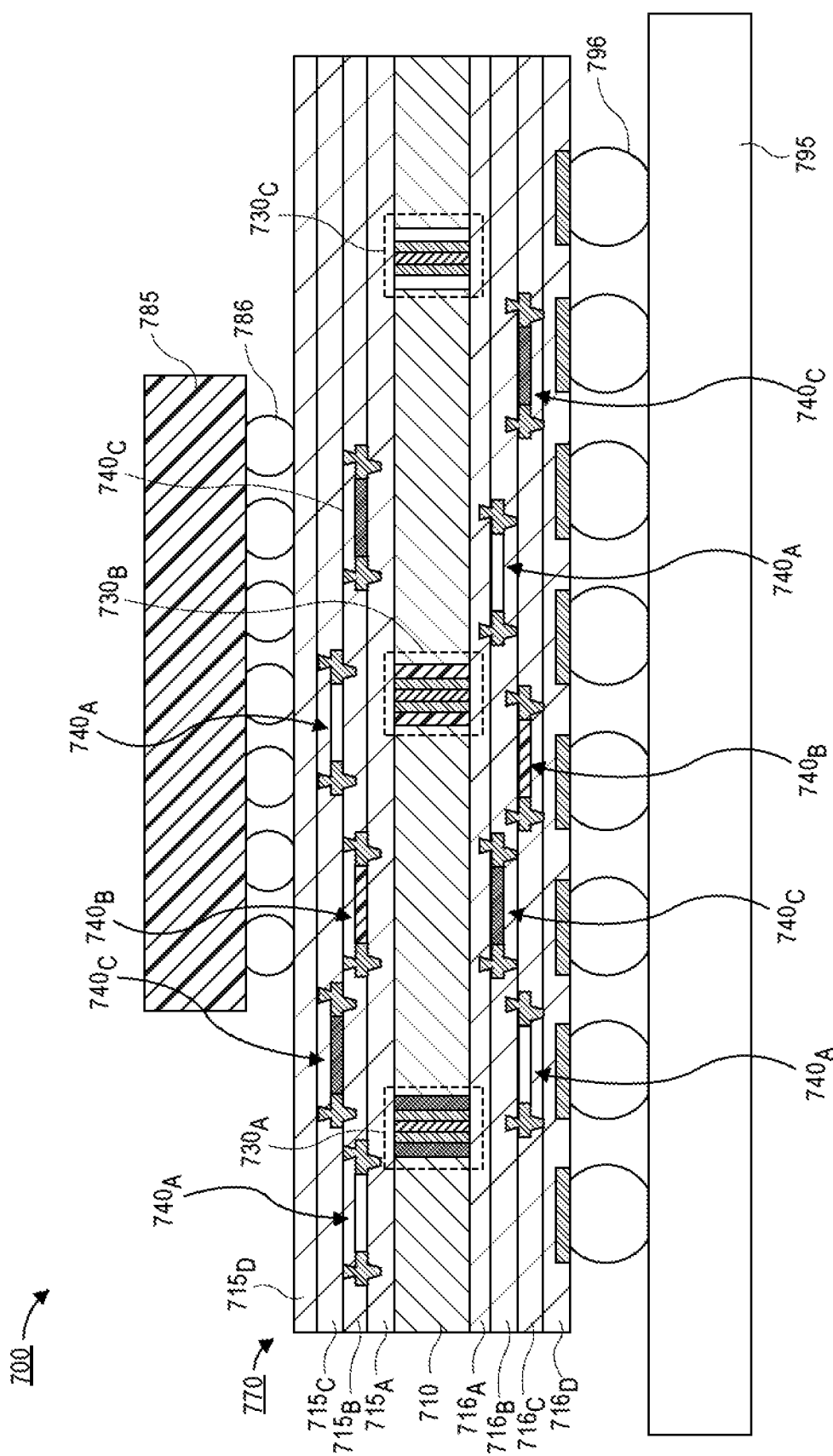
FIG. 7 is a cross-sectional illustration of an electronic system that comprises an electronic package that comprises different magnetic material compositions disposed in a single layer of the electronic package, in accordance with an embodiment.

Referring now to FIG. 7, a cross-sectional illustration of an electronic system 700 is shown in accordance with an embodiment. In an embodiment, the package system comprises a die 785 that is electrically coupled to a package substrate 770 by bumps 786. In additional embodiments, the die 785 may be electrically coupled to the package substrate 770 with any suitable interconnect architecture, such as wire bonding or the like. The package substrate 770 may be electrically coupled to a board 795, such as a printed circuit board (PCB) with solder bumps 796 or any other suitable interconnect architecture, such as wire bonding or the like.

In an embodiment, the package substrate 770 may comprise a core 710 and a plurality of dielectric layers $715_{A-D}$ over the core 710 and a plurality of dielectric layers $716_{A-D}$ below the core 710. In other embodiments, the package substrate 770 may be coreless. That is, the core 710 may optionally be omitted. In an embodiment, a plurality of plated through hole vias $730_{A-C}$ may pass through the core 710. In an embodiment, the plurality of plated through hole vias $730_{A-C}$ may comprise magnetic shells with two or more different magnetic material compositions, similar to what is described above.

In an embodiment, a plurality of passive devices may be embedded in the package substrate 770. For example, a plurality of inductors $740_{A-C}$ may be embedded in the package substrate 770. In some embodiments, inductors 740 in a single layer (e.g., layers $715_{A-D}$ or $716_{A-D}$) of the package substrate may comprise magnetic cores with two or more different magnetic material compositions. For example, in layer 715B, a first inductor $740_A$ comprises a first magnetic core, a second inductor 740B comprises a second magnetic core, and a third inductor 740c comprises a third magnetic core, where the first magnetic core, the second magnetic core, and the third magnetic core comprise different magnetic material compositions. In an embodiment, two or more layers of the package substrate 770 may each comprise a plurality of passive devices with more than one magnetic material composition. For example, layer 715B, layer 715c, layer 716B, and layer 716c each comprise a plurality of passive devices (e.g., inductors) with more than one magnetic material composition.

Furthermore, while passives with various magnetic material compositions are illustrated as being positioned in the package substrate 770, it is to be appreciated that such features may also be included in the board 795.

Figure 8:
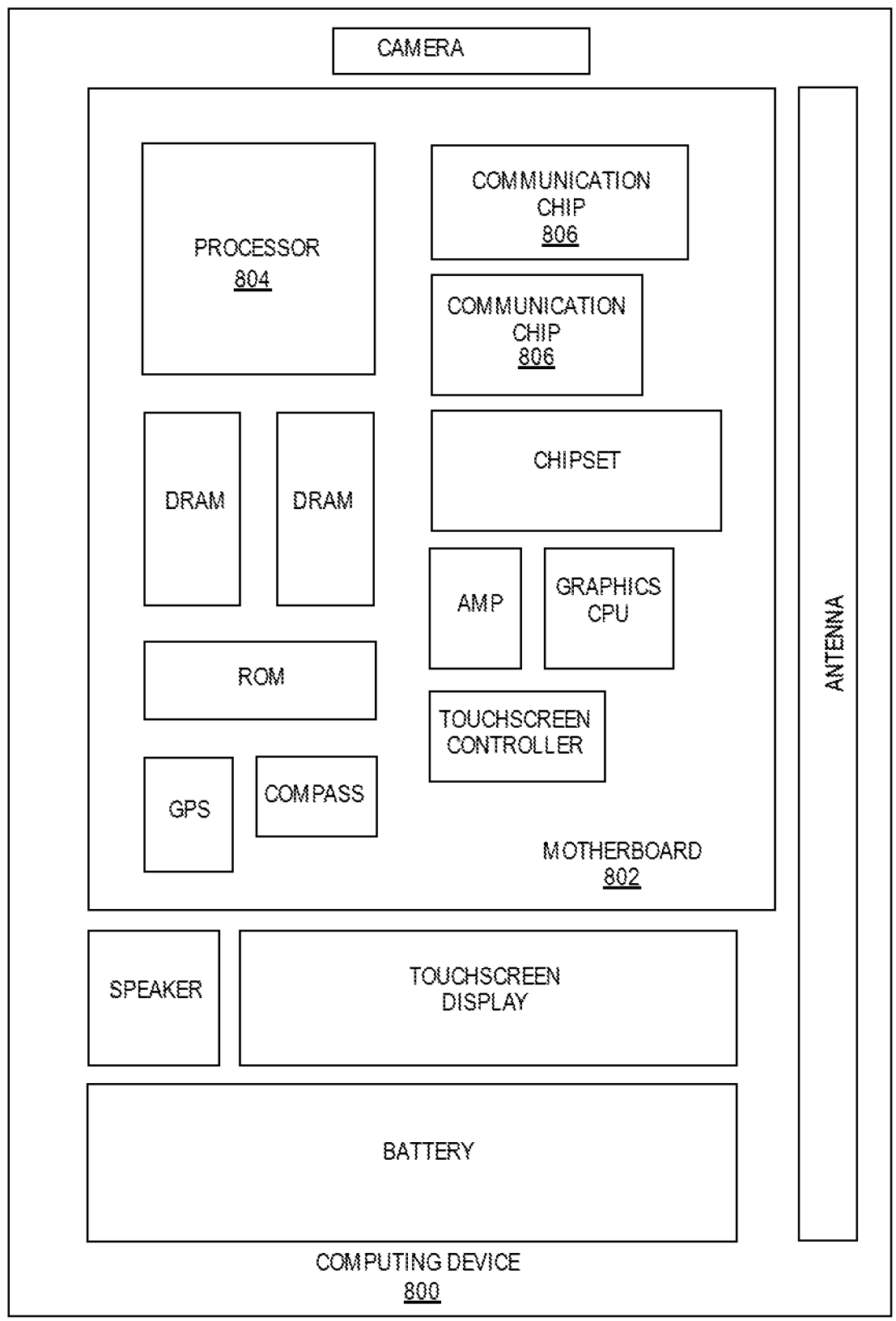
FIG. 8 is a schematic of a computing device built in accordance with an embodiment.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor may be packaged in an electronic system that comprises a package substrate with a plurality of passives components comprising two or more different magnetic material compositions in a single layer, in accordance with embodiments described herein. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip may be packaged in an electronic system that comprises a package substrate passives components comprising two or more different magnetic material compositions in a single layer, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a package substrate, wherein the package substrate comprises a plurality of dielectric layers; and a plurality of passive components in a first dielectric layer of the plurality of dielectric layers, wherein first passive components of the plurality of passive components each comprise a first magnetic material, and wherein second passive components of the plurality of passive components each comprise a second magnetic material, wherein a composition of the first magnetic material is different than a composition of the second magnetic material.

Example 2: the electronic package of Example 1, wherein the first passive components are included in a first circuitry block, and wherein the second passive components are included in a second circuitry block.

Example 3: the electronic package of Example 1 or Example 2, wherein the first circuitry block provides signal filtering, RF shielding, or power delivery, and wherein the second circuitry block provides a different one of signal filtering, RF shielding, or power delivery.

Example 4: the electronic package of Examples 1-3, wherein the first magnetic material has a first permeability and the second magnetic material has a second permeability that is different than the first permeability.

Example 5: the electronic package of Examples 1-4, wherein the plurality of passive components comprise inductors.

Example 6: the electronic package of Examples 1-5, wherein the inductors each comprise a conductive trace over the first dielectric layer, wherein the conductive trace is an open loop.

Example 7: the electronic package of Examples 1-6, wherein the first magnetic material and the second magnetic material are magnetic cores within volumes surrounded by the open loops of the inductors.

Example 8: the electronic package of Examples 1-7, wherein the magnetic material of each passive component is recessed into a cavity in the dielectric layer.

Example 9: the electronic package of Examples 1-8, wherein a number of first passive components is different than a number of second passive components.

Example 10: the electronic package of Examples 1-9, wherein the package substrate comprises a package core.

Example 11: the electronic package of Examples 1-10, wherein the package substrate comprises a plurality of plated through hole vias through the package core.

Example 12: the electronic package of Examples 1-11, wherein the plurality of plated through hole vias comprises: a first plated through hole via through the package core, wherein the first plated through hole via comprises: a core; a conductive shell laterally surrounding the core; and a first magnetic shell laterally surrounding the conductive shell, wherein the first magnetic shell comprises a third magnetic material; and a second plated through hole via through the package core, wherein the second plated through hole via comprises: a core; a conductive shell laterally surrounding the core; and a second magnetic shell laterally surrounding the conductive shell, wherein the second magnetic shell comprises a fourth magnetic material, wherein a composition of the fourth magnetic material is different than a composition of the third magnetic material.

Example 13: an electronic package, comprising: a dielectric layer; a first passive component on the dielectric layer, wherein the first passive component comprises a first magnetic material; and a second passive component on the dielectric layer, wherein the second passive component comprises a second magnetic material, and wherein a composition of the second magnetic material is different than a composition of the first magnetic material.

Example 14: the electronic package of Example 13, wherein the first passive component is a first inductor and the second passive component is a second inductor.

Example 15: the electronic package of Example 13 or Example 14, wherein the first inductor and the second inductor each comprise a conductive trace that is an open loop.

Example 16: the electronic package of Examples 13-15, wherein the first magnetic material is surrounded by the open loop of the first inductor, and the second magnetic material is surrounded by the open loop of the second inductor.

Example 17: the electronic package of Examples 13-16, wherein the first magnetic material is recessed into the dielectric layer.

Example 18: the electronic package of Examples 13-17, wherein the first magnetic material comprises a plurality of magnetic layers, wherein two or more of the magnetic layers of the plurality of magnetic layers comprise different compositions.

Example 19: an electronic package comprising: a package core; a first plated through hole via through the package core, wherein the first plated through hole via comprises a first magnetic material; and a second plated through hole via through the package core, wherein the second plated through hole via comprises a second magnetic material, wherein a composition of the second magnetic material is different than a composition of the first magnetic material.

Example 20: the electronic package of Example 19, wherein the first plated through hole via comprises: a core; a conductive shell laterally surrounding the core; and a first magnetic shell laterally surrounding the conductive shell, wherein the first magnetic shell comprises the first magnetic material; and wherein the second plated through hole via comprises: a core; a conductive shell laterally surrounding the core; and a second magnetic shell laterally surrounding the conductive shell, wherein the second magnetic shell comprises the second magnetic material.

Example 21: the electronic package of Example 19 or Example 20, wherein the first plated through hole via is included in a first circuitry block, and wherein the second plated through hole via is included in a second circuitry block.

Example 22: the electronic package of Examples 19-21, wherein the first circuitry block provides signal filtering, RF shielding, or power delivery, and wherein the second circuitry block provides a different one of signal filtering, RF shielding, or power delivery.

Example 23: an electronic system, comprising: a die; an electronic package, wherein the die is electrically coupled to the electronic package, and wherein the electronic package comprises: a package substrate, wherein the package substrate comprises a plurality of dielectric layers; and a plurality of passive components in a first dielectric layer of the plurality of dielectric layers, wherein first passive components of the plurality of passive components each comprise a first magnetic material, and wherein second passive components of the plurality of passive components each comprise a second magnetic material, wherein a composition of the second magnetic material is different than a composition of the first magnetic material.

Example 24: the electronic system of Example 23, wherein the electronic package is coupled to a printed circuit board (PCB).

Example 25: the electronic system of Example 23 or Example 24, wherein the first passive components are included in a first circuitry block, and wherein the second passive components are included in a second circuitry block, wherein the first circuitry block provides signal filtering, RF shielding, or power delivery, and wherein the second circuitry block provides a different one of signal filtering, RF shielding, or power delivery.

Example 26: a method of forming an electronic package, comprising: disposing a first trace and a second trace over a dielectric layer, wherein the first trace is a first open loop, and wherein the second trace is a second open loop; filling a first volume bounded by the first trace with a first magnetic material with a three dimensional (3D) printing nozzle; and filling a second volume bounded by the second trace with a second magnetic material with the 3D printing nozzle, wherein a composition of the second magnetic material is different than a composition of the first magnetic material.

Example 27: the method of Example 26, wherein the 3D printing nozzle is driven to the first volume and the second volume using a registration mark as a reference point.

Example 28: the method of Example 26 or Example 27, wherein a feedstock of the first magnetic material comprises a solid stick of the first magnetic material that is fed into the 3D printing nozzle and melted prior to dispensing, and wherein a feedstock of the second magnetic material comprises a solid stick of the second magnetic material that is fed into the 3D printing nozzle and melted prior to dispensing.

Example 29: a method of forming an electronic package, comprising: drilling a first through hole opening through a package core; drilling a second through hole opening through the package core; filling the first through hole opening with a first magnetic material dispensed by a three dimensional (3D) printing nozzle; filling the second through hole opening with a second magnetic material dispensed by the 3D printing nozzle, wherein a composition of the second magnetic material is different than a composition of the first magnetic material; drilling through the first magnetic material and the second magnetic material to form a first magnetic shell and a second magnetic shell; and plating sidewalls of the first magnetic shell and the second magnetic shell.

Example 30: the method of Example 29, further comprising: plugging each of the through hole openings with a through hole core.

What is claimed is:

1. An electronic package, comprising:
    a package substrate, wherein the package substrate comprises a plurality of dielectric layers; and
    a plurality of passive components in a first dielectric layer of the plurality of dielectric layers, wherein first passive components of the plurality of passive components each comprise a first magnetic material, and wherein second passive components of the plurality of passive components each comprise a second magnetic material, wherein a composition of the first magnetic material is different than a composition of the second magnetic material.

2. The electronic package of claim 1, wherein the first passive components are included in a first circuitry block, and wherein the second passive components are included in a second circuitry block.

3. The electronic package of claim 2, wherein the first circuitry block provides signal filtering, RF shielding, or power delivery, and wherein the second circuitry block provides a different one of signal filtering, RF shielding, or power delivery.

4. The electronic package of claim 2, wherein the first magnetic material has a first permeability and the second magnetic material has a second permeability that is different than the first permeability.

5. The electronic package of claim 1, wherein the plurality of passive components comprise inductors.

6. The electronic package of claim 5, wherein the inductors each comprise a conductive trace over the first dielectric layer, wherein the conductive trace is an open loop.

7. The electronic package of claim 6, wherein the first magnetic material and the second magnetic material are magnetic cores within volumes surrounded by the open loops of the inductors.

8. The electronic package of claim 7, wherein the magnetic material of each passive component is recessed into a cavity in the dielectric layer.

9. The electronic package of claim 1, wherein a number of first passive components is different than a number of second passive components.

10. The electronic package of claim 1, wherein the package substrate comprises a package core.

11. The electronic package of claim 10, wherein the package substrate comprises a plurality of plated through hole vias through the package core.

12. The electronic package of claim 11, wherein the plurality of plated through hole vias comprises:
a first plated through hole via through the package core, wherein the first plated through hole via comprises:
a core;
a conductive shell laterally surrounding the core; and
a first magnetic shell laterally surrounding the conductive shell, wherein the first magnetic shell comprises a third magnetic material; and
a second plated through hole via through the package core, wherein the second plated through hole via comprises:
a core;
a conductive shell laterally surrounding the core; and
a second magnetic shell laterally surrounding the conductive shell, wherein the second magnetic shell comprises a fourth magnetic material, wherein a composition of the fourth magnetic material is different than a composition of the third magnetic material.

13. An electronic system, comprising:
a die;
an electronic package, wherein the die is electrically coupled to the electronic package, and wherein the electronic package comprises:
a package substrate, wherein the package substrate comprises a plurality of dielectric layers; and
a plurality of passive components in a first dielectric layer of the plurality of dielectric layers, wherein first passive components of the plurality of passive components each comprise a first magnetic material, and wherein second passive components of the plurality of passive components each comprise a second magnetic material, wherein a composition of the second magnetic material is different than a composition of the first magnetic material.

14. The electronic system of claim 13, wherein the electronic package is coupled to a printed circuit board (PCB).

15. The electronic system of claim 13, wherein the first passive components are included in a first circuitry block, and wherein the second passive components are included in a second circuitry block, wherein the first circuitry block provides signal filtering, RF shielding, or power delivery, and wherein the second circuitry block provides a different one of signal filtering, RF shielding, or power delivery.

* * * * *